(12) United States Patent
Nagatomo

(10) Patent No.: US 11,146,237 B2
(45) Date of Patent: Oct. 12, 2021

(54) ACOUSTIC WAVE DEVICE

(71) Applicant: Murata Manufacturing Co., Ltd., Nagaokakyo (JP)

(72) Inventor: Shou Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 31 days.

(21) Appl. No.: 16/732,372

(22) Filed: Jan. 2, 2020

(65) Prior Publication Data

US 2020/0228092 A1 Jul. 16, 2020

(30) Foreign Application Priority Data

Jan. 16, 2019 (JP) .............................. JP2019-005426

(51) Int. Cl.
*H03H 9/17* (2006.01)
*H03H 9/145* (2006.01)
*H03H 9/58* (2006.01)
*H03H 9/02* (2006.01)

(52) U.S. Cl.
CPC ........ *H03H 9/175* (2013.01); *H03H 9/02015* (2013.01); *H03H 9/02543* (2013.01); *H03H 9/14541* (2013.01); *H03H 9/589* (2013.01)

(58) Field of Classification Search
CPC .... H03H 9/175; H03H 9/589; H03H 9/14541; H03H 9/02543; H03H 9/02015; H03H 9/02228; H03H 9/02086; H03H 9/174; H03H 9/02125; H03H 9/25; H03H 9/131; H03H 9/133

USPC .......................... 333/133, 187, 188, 193–196
See application file for complete search history.

(56) References Cited

U.S. PATENT DOCUMENTS

2004/0227591 A1 11/2004 Aigner et al.
2019/0372547 A1* 12/2019 Kishimoto .............. H03F 3/245

FOREIGN PATENT DOCUMENTS

JP          3987036 B2      10/2007

* cited by examiner

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes a support substrate, an acoustic reflection film on the support substrate, a piezoelectric layer on the acoustic reflection film, the piezoelectric layer including first and second primary surfaces, and first and second flat-plate electrodes on the first and second primary surfaces of the piezoelectric layer. The acoustic reflection film includes high acoustic impedance layers and low acoustic impedance layers alternately stacked together. At least one layer of the high acoustic impedance and low acoustic impedance layers is a stack of layers of first and second materials having equal or substantially equal acoustic impedances for at least one of longitudinal acoustic impedance and transversal acoustic impedance. The interface between the layers of first and second materials has irregularities.

16 Claims, 3 Drawing Sheets

ACOUSTIC WAVE DEVICE

CROSS REFERENCE TO RELATED APPLICATIONS

This application claims the benefit of priority to Japanese Patent Application No. 2019-005426 filed on Jan. 16, 2019. The entire contents of this application are hereby incorporated herein by reference.

BACKGROUND OF THE INVENTION

1. Field of the Invention

The present invention relates to an acoustic wave device.

2. Description of the Related Art

Acoustic wave devices are in widespread use, for example, in filters in cellular phones. Japanese Patent No. 3987036 discloses an example of an acoustic wave device that uses bulk acoustic waves (BAWs). This acoustic wave device has a piezoelectric layer and an electrode on each of the layer's two primary surfaces. The piezoelectric layer and the electrodes form a piezoelectric element, and this piezoelectric element is on an acoustic mirror. The acoustic mirror is a multilayer body formed by alternating layers of two materials, one having a low acoustic impedance and the other having a high acoustic impedance.

The acoustic wave device described in Japanese Patent No. 3987036 can suffer from spurious responses caused by a mirror mode, which is a wave mode that has been locked in the acoustic mirror. The mirror mode occurs in the frequency band of about 1.6 times or larger than the resonant frequency of the main mode, the wave mode utilized by the acoustic wave device. Once a mirror mode occurs, it can affect the filter characteristics, for example, of the acoustic wave device.

SUMMARY OF THE INVENTION

Preferred embodiments of the present invention provide acoustic wave devices with significantly reduced or prevented spurious responses caused by a mirror mode.

According to a preferred embodiment of the present invention, an acoustic wave device includes a support substrate; an acoustic reflection film on the support substrate; a piezoelectric layer on the acoustic reflection film, the piezoelectric layer including a first primary surface and a second primary surface opposite to each other; and at least one excitation electrode on at least one of the first and second primary surfaces of the piezoelectric layer. The acoustic reflection film includes at least one high acoustic impedance layer, which has a relatively high acoustic impedance, and at least one low acoustic impedance layer, which has a relatively low acoustic impedance, the high and low acoustic impedance layers alternately stacked together. At least one layer of the high acoustic impedance and low acoustic impedance layers is a stack of a layer of a first material and a layer of a second material, the first and second materials having equal or substantially equal acoustic impedances for at least one of longitudinal acoustic impedance and transversal acoustic impedance. The interface between the layers of the first and second materials includes irregularities.

Acoustic wave devices according to preferred embodiments of the present invention are not prone to spurious responses caused by a mirror mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following, the present invention will be clarified by describing specific preferred embodiments thereof with reference to the drawings.

It should be pointed out that the preferred embodiments described herein are for illustrative purposes. The configurations can be partially replaced or combined between different preferred embodiments.

Figure 1:
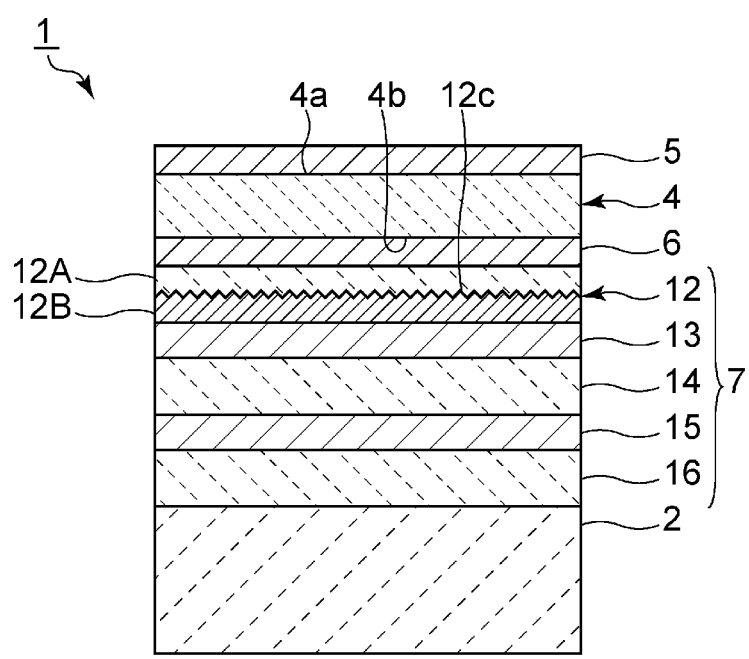
FIG. 1 is a front cross-sectional view of an acoustic wave device according to a first preferred embodiment of the present invention.

FIG. 1 is a front cross-sectional view of an acoustic wave device according to a first preferred embodiment of the present invention.

The acoustic wave device 1 includes a support substrate 2. The support substrate 2 in the first preferred embodiment is preferably a single-crystal silicon substrate, for example, but silicon is not the only possible material for the support substrate 2. Alternative materials include, for example, piezoelectrics, such as aluminum oxide, lithium tantalate, lithium niobate, and quartz; ceramics, such as alumina, magnesia, silicon nitride, aluminum nitride, silicon carbide, zirconia, cordierite, mullite, steatite, and forsterite; dielectrics, such as sapphire, diamond, and glass; semiconductors, such as gallium nitride; and resins.

On the support substrate 2 is an acoustic reflection film 7. On the acoustic reflection film 7 is a piezoelectric layer 4. The piezoelectric layer 4 includes a first primary surface 4a and a second primary surface 4b opposite to each other, with the second primary surface 4b closer to the acoustic reflection film 7. On the first primary surface 4a of the piezoelectric layer 4 is a first flat-plate electrode 5, and on the second primary surface 4b is a second flat-plate electrode 6. More specifically, the second flat-plate electrode 6 is between the acoustic reflection film 7 and the piezoelectric layer 4. A portion of the first flat-plate electrode 5 is opposite to a portion of the second flat-plate electrode 6.

The piezoelectric layer 4 in the first preferred embodiment is preferably an aluminum nitride layer, for example. More specifically, the piezoelectric layer 4 is an aluminum nitride layer doped with at least one rare-earth element selected from scandium, yttrium, and erbium, for example. The piezoelectric layer 4 may alternatively be an aluminum nitride layer not doped with a rare-earth element. Aluminum nitride is not the only possible material for the piezoelectric layer 4, and any other appropriate piezoelectric ceramic or piezoelectric single crystal can be used.

In the first preferred embodiment, the first and second flat-plate electrodes 5 and 6 are excitation electrodes, and the acoustic wave device 1 is a bulk acoustic wave (BAW) resonator. An acoustic wave device 1 according to a preferred embodiment of the present invention, however, may be a surface acoustic wave (SAW) resonator. Alternatively, an acoustic wave device 1 according to a preferred embodiment of the present invention may be a filter that includes BAW or SAW resonators.

The acoustic reflection film 7 is a multilayer body including multiple acoustic impedance layers. More specifically, the acoustic reflection film 7 includes multiple low acoustic impedance layers, which have a relatively low acoustic impedance, and multiple high acoustic impedance layers, which have a relatively high acoustic impedance. The low and high acoustic impedance layers alternate. To be more specific, the acoustic reflection film 7 includes a low acoustic impedance layer 12, a low acoustic impedance layer 14, and a low acoustic impedance layer 16 as well as a high acoustic impedance layer 13 and a high acoustic impedance layer 15. Of these layers of the acoustic reflection film 7, the low acoustic impedance layer 12 is closest to the piezoelectric layer 4.

Although the acoustic reflection film 7 in the first preferred embodiment includes three low acoustic impedance layers and two high acoustic impedance layers, this is not the only possible configuration. The acoustic reflection film 7 only needs to include at least one low acoustic impedance layer and at least one high acoustic impedance layer.

With an acoustic reflection film 7, the acoustic wave device 1 is a solidly mounted resonator (SMR) as well as being a BAW resonator. The device can therefore effectively confine the energy of acoustic waves to the piezoelectric layer 4 side.

As shown in FIG. 1, the low acoustic impedance layer 12 is a stack of a layer of first material 12A and a layer of second material 12B. The layer of first material 12A is closer to the piezoelectric layer 4, and the layer of second material 12B is closer to the support substrate 2. The layers of first and second materials 12A and 12B have equal or substantially equal acoustic impedances for at least one of longitudinal acoustic impedance and transversal acoustic impedance.

As described herein, that acoustic impedances of two different materials are equal or substantially equal means that the acoustic impedance $Z_1$ of one material falls within the range of the acoustic impedance $Z_2$ of the other plus/minus about 30%, for example. If the difference in an acoustic impedance between two different materials is in this range, an interface between layers of these two materials reflects little or no main mode. Therefore, the acoustic impedance can be considered to be equal or substantially equal between the materials. A stack of layers of materials having equal or substantially equal acoustic impedances, moreover, can be considered as one single acoustic impedance layer.

Table 1 lists examples of materials for the acoustic reflection film 7, along with their density, longitudinal acoustic velocity, transversal acoustic velocity, longitudinal acoustic impedance, and transversal acoustic impedance.

TABLE 1

| Material | Density [g/cm³] | Longitudinal acoustic velocity [m/s] | Transversal acoustic velocity [m/s] | Longitudinal acoustic impedance [MRayl] | Transversal acoustic impedance [MRayl] |
| --- | --- | --- | --- | --- | --- |
| SiO₂ | 2.21 | 5962 | 3759 | 13.18 | 8.31 |
| Al | 2.7 | 6354 | 3221 | 17.1 | 8.7 |
| W | 19.3 | 5220 | 2885 | 100.75 | 55.68 |
| Mo | 10.3 | 6290 | 3450 | 64.79 | 35.5 |
| HfO₂ | 9.68 | 5451 | 3013 | 52.87 | 29.22 |
| Ta₂O₅ | 7.9 | 4920 | 2900 | 38.87 | 22.91 |
| AlN | 3.3 | 11000 | 6450 | 36.3 | 21.28 |

In the first preferred embodiment, the layer of first material 12A of the low acoustic impedance layer 12 is preferably a silicon oxide (SiO₂) layer, for example, and the layer of second material 12B is preferably an aluminum (Al) layer, for example. As shown in Table 1, silicon oxide and aluminum have substantially equal acoustic impedances for both longitudinal and transversal acoustic impedances.

The low acoustic impedance layers 14 and 16 are preferably silicon oxide layers, for example. The high acoustic impedance layers 13 and 15 are preferably tungsten layers, for example. Each low or high acoustic impedance layer may include a material that is primarily any one of the materials listed in Table 1 or of a material not listed in Table 1. For example, it may be that the layer of first material 12A of the low acoustic impedance layer 12 is a silicon oxide layer with the layer of the second material 12B being a fluorine (F)-doped silicon oxide layer. Alternatively, the layer of second material 12B may be a silicon oxynitride layer.

The interface 12c between the layers of first and second materials 12A and 12B has irregularities. In the first preferred embodiment, when the arithmetic mean roughness (Ra) of the interface 12c between the layers of first and second materials 12A and 12B is expressed as $Ra_{IF}$, the $Ra_{IF}$ is preferably larger than, for example, about 0.2 times the thickness component, i.e., the component along the thickness of the acoustic impedance layer, of the wavelength of longitudinal or transversal waves that propagate in the layers of first and second materials 12A and 12B. The $Ra_{IF}$, moreover, is preferably smaller than, for example, about 0.2 times the thickness component of the wavelength of the main mode that propagates in the layers of first and second materials 12A and 12B. The arithmetic mean roughness (Ra) herein is as defined in JIS B 0601: 2013.

The $Ra_{IF}$ does not need to be within the above range. The only requirement is that the interface 12c between the layers of first and second materials 12A and 12B have irregularities. An irregular interface 12c can be created by, for example, as follows: The layer of first material 12A is formed. Then the surface of the layer of first material 12A is roughened, for example by etching. Then the layer of second material 12B is formed on the roughened surface of the layer of first material 12A. Alternatively, for example, the layer of first material 12A may be formed on a roughened surface of the layer of second material 12B. The formation of the layers of first and second materials 12A and 12B can be by sputtering, vacuum deposition, or any other appropriate process.

As mentioned above, a mirror mode refers to a wave mode that has been locked in the acoustic reflection film 7. A specific example of a wave mode that can become a mirror mode is longitudinal or transversal waves that propagate in the acoustic reflection film 7. A wave mode becomes a mirror mode by getting locked in, for example, a single acoustic impedance layer in the acoustic reflection film 7.

The first preferred embodiment includes the following features: 1) A low acoustic impedance layer 12 in the acoustic reflection film 7 is a stack of layers of first material 12A and second material 12B having equal or substantially equal acoustic impedances for at least one of longitudinal acoustic impedance and transversal acoustic impedance; 2) The interface 12c between the layers of first and second materials 12A and 12B has irregularities. According to these features, spurious responses caused by a mirror mode are significantly reduced or prevented. The following description compares the first preferred embodiment with a comparative example.

Figure 2:
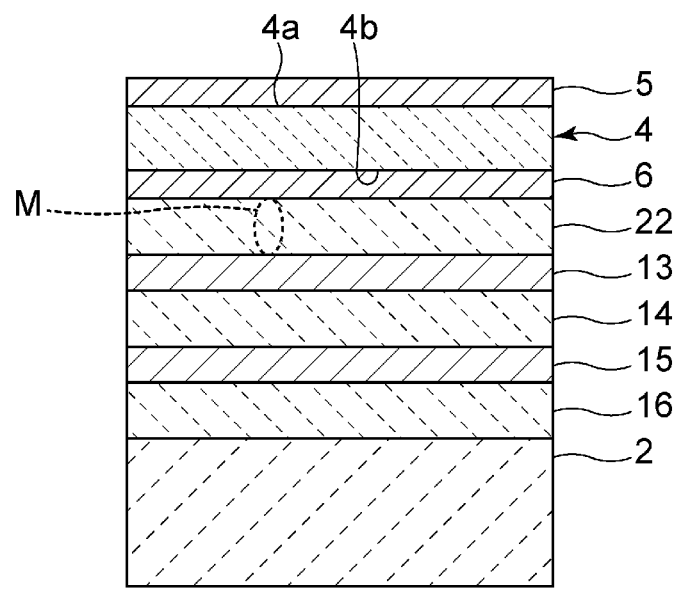
FIG. 2 is a front cross-sectional view of an acoustic wave device according to a comparative example.

FIG. 2 is a front cross-sectional view of an acoustic wave device according to a comparative example.

The acoustic wave device 1 according to the comparative example is different from the first preferred embodiment in that all low and high acoustic impedance layers are single layers. The low acoustic impedance layer 22 in FIG. 2 corresponds to the layer that is a stack of layers of first and second materials 12A and 12B in the first preferred embodiment. The low acoustic impedance layer 22 is a silicon oxide layer. In the comparative example, the mirror mode occurs as a wave mode that has been locked at least in the low acoustic impedance layer 22 as shown by broken line M in FIG. 2.

Figure 3:
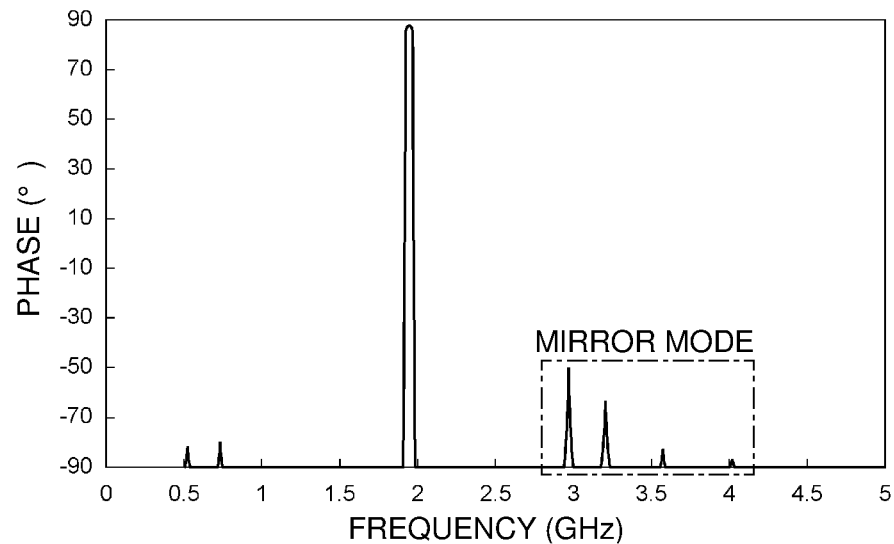
FIG. 3 is a diagram showing the phase characteristics of an acoustic wave device according to the comparative example.

FIG. 3 is a diagram showing the phase characteristics of the acoustic wave device according to the comparative example.

As shown in FIG. 3, the main mode is near 1.9 GHz. Multiple responses caused by the mirror mode are seen in the frequency band of about 1.6 times or larger than the frequency of the main mode, indicated by the dash-dot line in FIG. 3. Once locked in the low acoustic impedance layer 22, a wave mode causing spurious responses does not easily reach the support substrate 2. Even if the lower surface of the support substrate 2, for example, in FIG. 2 had irregularities, it would be difficult with them to significantly reduce or prevent spurious responses caused by the mirror mode.

In the first preferred embodiment, shown in FIG. 1, a low acoustic impedance layer 12 is a stack of layers of first and second materials 12A and 12B, and the interface 12c between the layers of first and second materials 12A and 12B has irregularities that scatter the mirror mode. More specifically, the interface 12c has irregularities that scatter longitudinal or transversal waves precursory to the mirror mode. According to this feature, the mirror mode is scattered, and spurious responses caused by the mirror mode are significantly reduced or prevented.

Preferably, for example, the arithmetic mean roughness (Ra) of this interface 12c, $Ra_{IF}$, is larger than about 0.2 times the thickness component, i.e., the component along the thickness of the acoustic impedance layers, of the wavelength of longitudinal or transversal waves that propagate in the layers of first and second materials 12A and 12B as in the first preferred embodiment. This ensures effective scattering of the mirror mode. Preferably, for example, the $Ra_{IF}$ is at the same time smaller than about 0.2 times the thickness component of the wavelength of the main mode that propagates in the layers of first and second materials 12A and 12B. This limits the scattering of the main mode in the low acoustic impedance layer 12, thus ensuring that the mirror mode is effectively scattered without affecting the characteristics of the device.

More preferably, for example, the $Ra_{IF}$ is about ¼ of the thickness component of the wavelength of longitudinal or transversal waves that propagate in the layers of first and second materials 12A and 12B. In more specific terms, when the wavelength of the wave mode to be locked in the acoustic reflection film 7, precursory to the mirror mode and therefore causing spurious responses, is expressed as $\lambda_{sp}$, the $Ra_{IF}$ is preferably about ¼ of the wavelength $\lambda_{sp}$, for example. To be more specific, the wavelength $\lambda_{sp}$ is the wavelength of the wave mode that is to be locked in an acoustic impedance layer. This arrangement provides more effective scattering of the mirror mode. In the first preferred embodiment, the wavelength $\lambda_{sp}$ represents the thickness component, along the thickness of the acoustic impedance layers, of the wavelength of the wave mode precursory to the mirror mode.

When the frequency of a spurious response caused by the wave mode to be locked in the acoustic reflection film 7, precursory to the mirror mode, is expressed as $f_{sp}$, and the acoustic velocity of bulk waves in the layers of the film as $v_B$, the relationship below holds true. The frequency $f_{sp}$ of the spurious response is that in terms of resonance characteristics, for example, phase characteristics.

$$\lambda_{sp} = \frac{v_B}{4f_{sp}}$$

Moreover, when the fastest and slowest acoustic velocities of bulk waves in the layers of first and second materials 12A and 12B are expressed as $v_{Bfastest}$ and $b_{Bslowest}$, the wavelength $\lambda_{sp}$ is in the range determined by the acoustic velocities $v_{Bfastest}$ and $v_{Bslowest}$. If the $Ra_{IF}$ is about ¼ of the wavelength $\lambda_{sp}$, it satisfies the relationship of formula 1.

$$\frac{v_{Bslowest}}{4f_{sp}} < Ra_{IF} < \frac{v_{Bfastest}}{4f_{sp}} \qquad \text{Formula 1}$$

An $Ra_{IF}$ that is about ¼ of the wavelength $\lambda_{sp}$ always satisfies the relationship of formula 1, but an $Ra_{IF}$ that satisfies the relationship of formula 1 is not always about ¼ of the wavelength $\lambda_{sp}$. An $Ra_{IF}$ that satisfies the relationship of formula 1, however, is more likely to be close to ¼ of the wavelength $\lambda_{sp}$, and therefore is more effective in scattering the mirror mode, than an $Ra_{IF}$ that does not. More preferably, for example, the $Ra_{IF}$ is about ¼ of the wavelength $\lambda_{sp}$.

If the mirror mode causes spurious responses at multiple frequencies, the $f_{sp}$ in formula 1 is preferably the frequency of the most intense spurious response, for example. Alternatively, the $Ra_{IF}$ is preferably about ¼ of the wavelength $\lambda_{sp}$ determined with the frequency of the most intense spurious response as $f_{sp}$, for example. These ensure that the characteristics of the acoustic wave device 1 are not affected greatly.

In the first preferred embodiment, the low acoustic impedance layer 12, closest to the piezoelectric layer 4, is a stack of layers of first and second materials 12A and 12B, and the interface 12c between the layers of first and second materials 12A and 12B has irregularities that scatter the mirror mode. There may be another acoustic impedance layer similar to the low acoustic impedance layer 12. In this case, the mirror mode is scattered not only by the low acoustic impedance layer 12 but also by another acoustic impedance layer. Furthermore, it may be that multiple acoustic impedance layers of the acoustic reflection film 7 are stacks of layers of first and second materials having an irregular interface therebetween for the scattering of the mirror mode. In this case, each relevant acoustic impedance layer preferably satisfies the relationship of formula 1, for example. More preferably, for example, $Ra_{IF}$ in each relevant acoustic impedance layer is about ¼ of the wavelength $\lambda_{sp}$.

The first preferred embodiment, however, works as long as at least one of the low and high acoustic impedance layers of the acoustic reflection film 7 is a stack of layers of first and second materials having an irregular interface therebetween.

Figure 4:
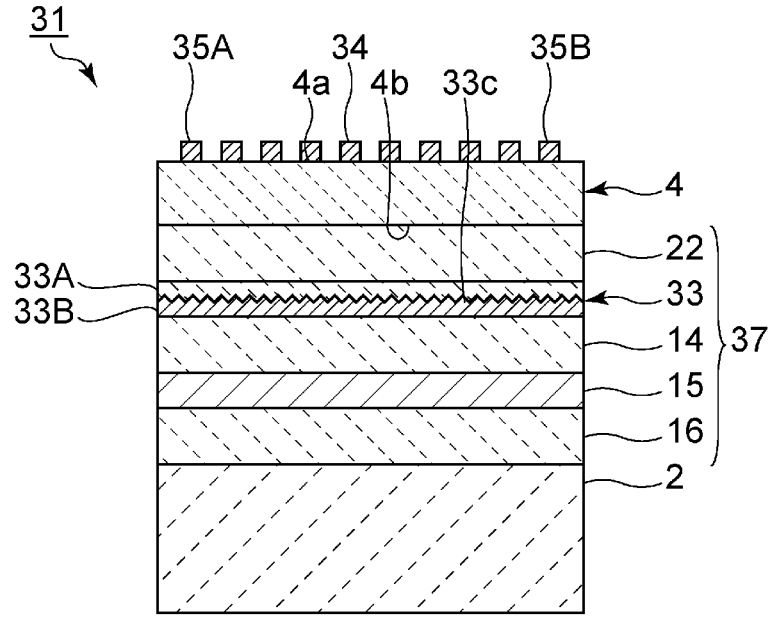
FIG. 4 is a front cross-sectional view of an acoustic wave device according to a second preferred embodiment of the present invention.

FIG. 4 is a front cross-sectional view of an acoustic wave device according to a second preferred embodiment of the present invention.

The acoustic wave device 31 is a SAW resonator that includes an interdigital transducer (IDT) 34 as excitation electrodes. In the second preferred embodiment, the piezoelectric layer 4 is preferably a lithium niobate layer, for example. The material for the piezoelectric layer 4 does not need to be lithium niobate and can be, for example, lithium tantalate or aluminum nitride. Preferably, for example, the first and second primary surfaces 4a and 4b of the piezoelectric layer 4 are X-cut or rotated Y-cut surfaces.

Figure 5:
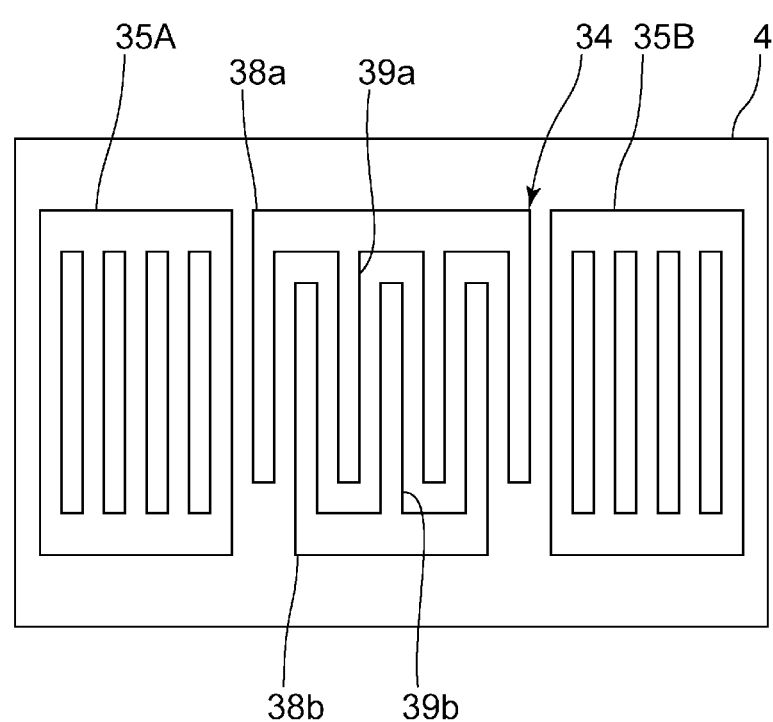
FIG. 5 is a plan view of an acoustic wave device according to the second preferred embodiment of the present invention.

FIG. 5 is a plan view of an acoustic wave device according to the second preferred embodiment.

The IDT 34 includes a first busbar 38a and a second busbar 38b opposite to each other. The IDT 34 includes multiple first electrode fingers 39a each coupled at one end to the first busbar 38a and also includes multiple second electrode fingers 39b each coupled at one end to the second busbar 38b. The first and second sets of electrode fingers 39a and 39b are interdigitated.

In the second preferred embodiment, the IDT 34 is on the first primary surface 4a of the piezoelectric layer 4. The acoustic wave device 31 only needs to include an IDT 34 on at least one of the first and second primary surfaces 4a and 4b of the piezoelectric layer 4.

Applying an alternating voltage across the IDT 34 results in the production of acoustic waves. A pair of reflectors 35A and 35B are on the piezoelectric layer 4, one on one side of the IDT 34 in the direction in which the acoustic waves propagate and the other on the other side. The IDT 34 and reflectors 35A and 35B may include any material, but in the second preferred embodiment they are preferably single-layer aluminum-copper (Al—Cu) alloy films, for example. The IDT 34 and reflectors 35A and 35B may alternatively be multilayer metal films, i.e., stacks of multiple metal layers.

When the wavelength of the IDT 34, determined by the IDT's finger pitch, is expressed as $\lambda_{IDT}$, it can be described as $\lambda_{IDT}=2p$, where p is the finger pitch of the IDT 34. Preferably, for example, the thickness of the piezoelectric layer 4 is equal to or smaller than about $1\lambda_{IDT}$. This means the piezoelectric layer 4 and the acoustic reflection film 37 have been stacked together, and this is effective to increase the coupling coefficient and Q. An SAW resonator having such a structure is called a multi-layered SAW resonator, a guided SAW resonator, a plate mode resonator, etc. Preferred embodiments of the present invention are suitable particularly if the main mode is longitudinal SAWs, or if the acoustic velocity of acoustic waves in the piezoelectric layer 4 is faster than that of transversal bulk waves in the support substrate 2.

Referring back to FIG. 4, in the second preferred embodiment, the high acoustic impedance layer 33, closest to the piezoelectric layer 4, is a stack of a layer of first material 33A and a layer of second material 33B. The interface 33c between the layers of first and second materials 33A and 33B has irregularities that scatter the mirror mode. The layer of first material 33A is preferably a hafnium oxide ($HfO_2$) layer, and the layer of second material 33B is preferably a molybdenum (Mo) layer, for example. As in the first preferred embodiment, spurious responses caused by the mirror mode are significantly reduced or prevented due to this structure.

The materials for the layers of first and second materials 33A and 33B in the high acoustic impedance layer 33 do not need to be those specified above. For example, the layer of first material 33A may be a layer of one metal selected from tungsten, molybdenum, ruthenium (Ru), platinum (Pt), niobium (Nb), tantalum (Ta), and iridium (Ir), and the layer of second material 33B may be a layer of an alloy that is primarily the metal forming the layer of first material 33A. Alternatively, both of the layers of first and second materials 33A and 33B may be, for example, layers including two materials selected from molybdenum, hafnium nitride, and hafnium oxide or layers of a material that is primarily any of these materials, for example.

As mentioned above, the acoustic wave device 31 is an SAW resonator, and a wave mode it generates has two components of wavelength. One is the propagation component, the component in the direction in which the wave mode propagates on the piezoelectric layer 4, and is determined by the finger pitch p of the IDT 34. The other is the thickness component $\lambda_z$, the component along the thickness of the acoustic impedance layers, and $\lambda_z$ is expressed as follows, where f is the frequency of the wave mode.

$$\frac{1}{\lambda_Z} = \sqrt{\frac{f^2}{v_B^2} - \frac{1}{4p^2}}$$

Furthermore, if the $Ra_{IF}$ is ¼ of the wavelength $\lambda_{sp}$ of the wave mode precursory to the mirror mode, the $Ra_{IF}$ satisfies the relationship of formula 2, which uses the fastest acoustic velocity $v_{Bfastest}$ and slowest acoustic velocity $v_{Bslowest}$ of bulk waves in the layers of first and second materials 33A and 33B. As in the first preferred embodiment, the wavelength $\lambda_{sp}$ is the thickness component, the component along the thickness of the acoustic impedance layers, of the wavelength of the wave mode precursory to the mirror mode.

$$4\sqrt{\frac{f_{sp}^2}{v_{B_{fastest}}^2} - \frac{1}{4p^2}} < \frac{1}{Ra_{IF}} < 4\sqrt{\frac{f_{sp}^2}{v_{B_{slowest}}^2} - \frac{1}{4p^2}} \quad \text{Formula 2}$$

An $Ra_{IF}$ that satisfies the relationship of formula 2 is more likely to be close to ¼ of the wavelength $\lambda_{sp}$, and therefore is more effective in scattering the mirror mode, than an $Ra_{IF}$ that does not. More preferably, for example, the $Ra_{IF}$ is about ¼ of the wavelength $\lambda_{sp}$.

If the mirror mode causes spurious responses at multiple frequencies, the $f_{sp}$ in formula 2 is preferably the frequency of the most intense spurious response, for example. Alternatively, the $Ra_{IF}$ is preferably about ¼ of the wavelength $\lambda_{sp}$ determined with the frequency of the most intense spurious response as $f_{sp}$, for example. These ensure that the characteristics of the acoustic wave device 31 are not affected greatly.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
an acoustic reflection film on the support substrate;
a piezoelectric layer on the acoustic reflection film, the piezoelectric layer including a first primary surface and a second primary surface opposite to each other; and
at least one excitation electrode on at least one of the first and second primary surfaces of the piezoelectric layer; wherein
the acoustic reflection film includes at least one high acoustic impedance layer, which has a relatively high acoustic impedance, and at least one low acoustic impedance layer, which has a relatively low acoustic impedance, the high and low acoustic impedance layers being alternately stacked together;
at least one layer of the high acoustic impedance and low acoustic impedance layers is a stack of a layer of a first material and a layer of a second material, the first and second materials having equal or substantially equal acoustic impedances for at least one of longitudinal acoustic impedance and transversal acoustic impedance; and
an interface between the layers of the first and second materials includes irregularities.

2. The acoustic wave device according to claim 1, wherein an arithmetic mean roughness, Ra, of the interface between the layers of the first and second materials is expressed as $Ra_{IF}$, and a thickness component is a component along a thickness of the acoustic impedance layers;
the $Ra_{IF}$ is larger than about 0.2 times a thickness component of a wavelength of a longitudinal or transversal wave that propagates in the layers of the first and second materials; and
the $Ra_{IF}$ is smaller than about 0.2 times a thickness component of a wavelength of a main mode that propagates in the layers of the first and second materials.

3. The acoustic wave device according to claim 1, wherein the at least one excitation electrode is a first flat-plate electrode provided on the first primary surface of the piezoelectric layer and a second flat-plate electrode provided on the second primary surface of the piezoelectric layer.

4. The acoustic wave device according to claim 3, wherein when an arithmetic mean roughness, Ra, of the interface between the layers of the first and second materials is expressed as $Ra_{IF}$, a frequency of a spurious response due to a wave mode to be locked in the acoustic reflection film is expressed as $f_{sp}$, and fastest and slowest acoustic velocities of a bulk wave in the layers of the first and second materials are expressed as $v_{Bfastest}$ and $v_{Bslowest}$, respectively, formula 1 is satisfied:

$$\frac{v_{B_{slowest}}}{4f_{sp}} < Ra_{IF} < \frac{v_{B_{fastest}}}{4f_{sp}}. \qquad \text{Formula 1}$$

5. The acoustic wave device according to claim 4, wherein a thickness component is a component along a thickness of the acoustic impedance layers; and the $Ra_{IF}$ is about ¼ of a thickness component of a wavelength of the wave mode to be locked in the acoustic reflection film.

6. The acoustic wave device according to claim 1, wherein the at least one excitation electrode is at least one interdigital transducer (IDT) on at least one of the first and second primary surfaces of the piezoelectric layer.

7. The acoustic wave device according to claim 6, wherein when an arithmetic mean roughness, Ra, of the interface between the layers of the first and second materials is expressed as $Ra_{IF}$, a frequency of a spurious response due to a wave mode to be locked in the acoustic reflection film is expressed as $f_{sp}$, fastest and slowest acoustic velocities of a bulk wave in the layers of the first and second materials are expressed as $v_{Bfastest}$ and $v_{Bslowest}$, respectively, and a finger pitch of the at least one IDT is expressed as p, formula 2 is satisfied:

$$4\sqrt{\frac{f_{sp}^2}{v_{B_{fastest}}^2} - \frac{1}{4p^2}} < \frac{1}{Ra_{IF}} < 4\sqrt{\frac{f_{sp}^2}{v_{B_{slowest}}^2} - \frac{1}{4p^2}}. \qquad \text{Formula 2}$$

8. The acoustic wave device according to claim 6, wherein a wavelength of the at least one IDT, determined by a finger pitch of the at least one IDT, is expressed as $\lambda_{IDT}$; and
the piezoelectric layer has a thickness equal to or smaller than about $1\lambda_{IDT}$.

9. The acoustic wave device according to claim 1, wherein the support substrate is a single-crystal silicon substrate.

10. The acoustic wave device according to claim 1, wherein the piezoelectric layer is an aluminum nitride layer doped with at least one rare-earth element selected from scandium, yttrium, and erbium.

11. The acoustic wave device according to claim 1, wherein the acoustic wave device is a bulk acoustic wave (BAW) resonator or a surface acoustic wave (SAW) resonator.

12. The acoustic wave device according to claim 1, wherein one of the at least one low acoustic impedance layer is a layer closest to the piezoelectric layer.

13. The acoustic wave device according to claim 1, wherein the acoustic wave device is a solidly mounted resonator (SMR).

14. The acoustic wave device according to claim 1, wherein, for the at least one of longitudinal acoustic impedance and transversal acoustic impedance of the at least one layer of the high acoustic impedance and low acoustic impedance layers, an acoustic impedance of the first material and an acoustic impedance of the second material differ by less than about 30%.

15. The acoustic wave device according to claim 1, wherein
the first material is silicon oxide; and
the second material is one of aluminum, fluorine-doped silicon oxide, and silicon oxynitride.

16. The acoustic wave device according to claim 1, wherein the high acoustic impedance layer includes tungsten.

* * * * *